US010546519B2

(12) United States Patent
Wang et al.

(10) Patent No.: US 10,546,519 B2
(45) Date of Patent: Jan. 28, 2020

(54) GATE DRIVING CIRCUITS AND DISPLAY PANELS

(71) Applicant: BOE Technology Group Co., Ltd., Beijing (CN)

(72) Inventors: Ling Wang, Beijing (CN); Quanhu Li, Beijing (CN); Longyan Wang, Beijing (CN); Baoxia Zhang, Beijing (CN); Cuili Gai, Beijing (CN); Yicheng Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 169 days.

(21) Appl. No.: 15/565,853

(22) PCT Filed: Mar. 22, 2017

(86) PCT No.: PCT/CN2017/077670
§ 371 (c)(1),
(2) Date: Oct. 11, 2017

(87) PCT Pub. No.: WO2017/202124
PCT Pub. Date: Nov. 30, 2017

(65) Prior Publication Data
US 2018/0204495 A1 Jul. 19, 2018

(30) Foreign Application Priority Data
May 24, 2016 (CN) .......................... 2016 1 0350253

(51) Int. Cl.
G11C 19/00 (2006.01)
G09G 3/20 (2006.01)
(Continued)

(52) U.S. Cl.
CPC ............. *G09G 3/20* (2013.01); *G09G 3/3266* (2013.01); *G09G 3/3674* (2013.01); *G11C 19/28* (2013.01);
(Continued)

(58) Field of Classification Search
None
See application file for complete search history.

(56) References Cited

U.S. PATENT DOCUMENTS

2008/0101529 A1* 5/2008 Tobita .................. G09G 3/3677
377/64
2008/0219401 A1* 9/2008 Tobita .................. G09G 3/3677
377/79
(Continued)

FOREIGN PATENT DOCUMENTS

CN 101122697 A 2/2008
CN 101582686 A 11/2009
(Continued)

OTHER PUBLICATIONS

International Search Report and Written Opinion of English Translation of International Search Report and Written Opinion from International Patent Application No. PCT/CN2017/077670, dated Jul. 10, 2017, 26 pages.
(Continued)

*Primary Examiner* — Tuan T Lam
(74) *Attorney, Agent, or Firm* — Westman, Champlin & Koehler, P.A.

(57) ABSTRACT

The embodiments of the present disclosure disclose a gate driving circuit and a display panel. In the gate driving circuit, a control unit of a shift register may input a dual pulse control signal to a first control terminal of an output unit; and the output unit outputs a scanning signal having a pulse width equal to a pulse period of the dual pulse control
(Continued)

signal to a corresponding gate line under the control of the dual pulse control signal. In this way, the output unit is controlled by the control unit to output a scanning signal of which a pulse width may be modulated, so as to output a gate signal of which a pulse width may be modulated.

18 Claims, 11 Drawing Sheets

(51) Int. Cl.
  *G09G 3/36* (2006.01)
  *G09G 3/3266* (2016.01)
  *G11C 19/28* (2006.01)
(52) U.S. Cl.
  CPC ... *G09G 3/3677* (2013.01); *G09G 2310/0286* (2013.01); *G09G 2310/08* (2013.01)

(56) References Cited

U.S. PATENT DOCUMENTS

| | | | | |
|---|---|---|---|---|
| 2014/0177780 | A1* | 6/2014 | Qi | G09G 3/20 377/64 |
| 2016/0163401 | A1* | 6/2016 | Nonaka | G11C 19/28 345/214 |
| 2016/0189626 | A1* | 6/2016 | Sun | G09G 3/3266 345/212 |
| 2016/0189795 | A1* | 6/2016 | Chen | G09G 3/20 377/70 |
| 2016/0329015 | A1* | 11/2016 | Ji | G09G 3/32 |
| 2016/0372041 | A1* | 12/2016 | Sun | G09G 3/20 |
| 2017/0309211 | A1* | 10/2017 | Zhang | G09G 3/20 |

FOREIGN PATENT DOCUMENTS

| | | |
|---|---|---|
| CN | 101976556 A | 2/2011 |
| CN | 102005197 A | 4/2011 |
| CN | 102237034 A | 11/2011 |
| CN | 105304057 A | 2/2016 |
| CN | 205247873 U | 5/2016 |
| CN | 105788508 A | 7/2016 |
| KR | 20140024994 A | 3/2014 |

OTHER PUBLICATIONS

First Office Action from Chinese Patent Application No. 201610350253.0, dated Dec. 5, 2016, 6 pages.
Second Office Action from Chinese Patent Application No. 201610350253.0, dated Mar. 27, 2017, 4 pages.

* cited by examiner

GATE DRIVING CIRCUITS AND DISPLAY PANELS

CROSS-REFERENCE TO RELATED APPLICATION

The present application is a National Stage Application of PCT Application No. PCT/CN2017/077670, which claims priority to the Chinese Patent Application No. 201610350253.0, filed on May 24, 2016, which is incorporated herein by reference in its entirety.

TECHNICAL FIELD

The present disclosure relates to the field of display technology, and more particularly, to a gate driving circuit and a display panel.

BACKGROUND

In a conventional technology, a gate driving circuit is provided at an edge of a display panel for the purpose of reducing the production cost of the display panel, wherein the gate driving circuit comprises a plurality of shift registers each corresponding to a gate line, the plurality of shift registers are arranged in a cascaded manner and there is a trigger signal between two adjacent shift registers to be passed stage by stage. After each shift register receives the trigger signal, the shift register outputs a corresponding gate line scanning signal to a corresponding gate line and transmits the trigger signal to a next stage of unit circuit to realize driving of a gate. However, in a process of driving the display panel, a gate driving signal of which a pulse width may be modulated is required. The conventional gate driving circuit cannot produce a gate signal of which a pulse width may be modulated.

Therefore, there is a need for a gate driving circuit to realize output of a gate driving signal of which a pulse width may be modulated.

SUMMARY

The embodiments of the present disclosure provide a gate driving circuit, comprising: a plurality of cascaded shift registers in one-to-one correspondence with gate lines, each shift register comprising an output unit and a control unit, wherein an output terminal of a control unit of each of the shift registers is connected to a first control terminal of an output unit of a current stage of shift register or a next stage of shift register which is adjacent to the current stage of shift register;

the control unit is configured to input a dual pulse control signal to the first control terminal of the output unit through the output terminal; and the output unit is configured to output a scanning signal having a pulse width equal to a pulse period of the dual pulse control signal to a corresponding gate line under the control of the dual pulse control signal.

According to the embodiments of the present disclosure, the control unit has a first control terminal configured to input a first control signal, a second control terminal configured to input a first reset signal, a third control terminal, a first input terminal and a second input terminal configured to input a first reference signal, a third input terminal configured to input a second reference signal, a fourth input terminal configured to input a clock signal and an output terminal connected to the first control terminal of the output unit; and the control unit is configured to output the second reference signal or the clock signal to the first control terminal of the output unit under the control of the first control signal, the first reset signal and the first reference signal; and the output unit has a second control terminal and a first input terminal configured to input a second control signal, a third control terminal, a second input terminal and a third input terminal configured to input the first reference signal, a fourth input terminal configured to input a second reset signal, a fifth input terminal configured to input the second reference signal, and an output terminal configured to output a signal to the corresponding gate line; and the output unit is configured to output the first reference signal or the second reference signal to the corresponding gate line under the control of the output terminal of the control unit, the first reference signal and the second control signal.

According to the embodiments of the present disclosure, the control unit comprises a first pull-up unit, a first pull-down unit, a first output unit and a first control unit, wherein the first pull-up unit has a control terminal configured to input the first control signal, an input terminal configured to input the first reference signal and an output terminal connected to the first node; and the first pull-up unit is configured to output the first reference signal to the first node under the control of the first control signal;

the first pull-down unit has a first control terminal connected to the second node, a second control terminal configured to input the first reset signal, an input terminal configured to input the second reference signal and an output terminal connected to the first node; and the first pull-down unit is configured to output the second reference signal to the first node under the control of the second node or the first reset signal;

the first output unit has a first control terminal connected to the first node, a second control terminal configured to input the first reset signal, a third control terminal connected to the second node, a first input terminal configured to input the clock signal, a second input terminal configured to input the second reference signal and an output terminal connected to the first control terminal of the output unit; and the first output unit is configured to output the clock signal to the first control terminal of the output unit under the control of the first node, and output the second reference signal to the first control terminal of the output unit under the control of the second node or the first reset signal; and the first control unit has a first control terminal and a first input terminal configured to input the first reference signal, a second control terminal connected to the first node, a second input terminal configured to input the second reference signal and an output terminal connected to the second node; and the first control unit is configured to output the first reference signal to the second node under the control of the first reference signal and output the second reference signal to the second node under the control of the first node.

According to the embodiments of the present disclosure, the first output unit comprises a first signal output unit and a second signal output unit, wherein the first signal output unit has a control terminal connected to the first node, an input terminal configured to input the clock signal and an output terminal connected to the first control terminal of the output unit; and the first signal output unit is configured to output the clock signal to the first control terminal of the output unit under the control of the first node; and the second signal output unit has a first control terminal configured to input the first reset signal, a second control terminal connected to the second node, an input terminal configured to input the second reference signal, and an output terminal connected to the first control terminal of the output unit; and the second signal output unit is configured to output the second reference signal to the first control terminal of the output unit under the control of the second node or the first reset signal.

According to the embodiments of the present disclosure, the first signal output unit comprises a first switch transistor and a first capacitor, wherein the first switch transistor has a gate connected to the first node, a source configured to input the clock signal and a drain connected to the first control terminal of the output unit; and the first capacitor is connected between the first node and the first control terminal of the output unit.

According to the embodiments of the present disclosure, the second signal output unit comprises a second switch transistor and a third switch transistor, wherein the second switch transistor has a gate configured to input the first reset signal, a source configured to input the second reference signal and a drain connected to the first control terminal of the output unit; and the third switch transistor has a gate connected to the second node, a source configured to input the second reference signal and a drain connected to the first control terminal of the output unit.

According to the embodiments of the present disclosure, the first pull-up unit comprises a fourth switch transistor, wherein the fourth switch transistor has a gate configured to input the first control signal, a source configured to input the first reference signal and a drain connected to the first node.

According to the embodiments of the present disclosure, the first pull-down unit comprises a fifth switch transistor and a sixth switch transistor, wherein the fifth switch transistor has a gate connected to the second node, a source configured to input the second reference signal and a drain connected to the first node; and the sixth switch transistor has a gate configured to input the first reset signal, a source configured to input the second reference signal and a drain connected to the first node.

According to the embodiments of the present disclosure, the first control unit comprises a seventh switch transistor and an eighth switch transistor, wherein the seventh switch transistor has a gate and a source configured to input the first reference signal and a drain connected to the second node; and the eighth switch transistor has a gate connected to the first node, a source configured to input the second reference signal and a drain connected to the second node.

According to the embodiments of the present disclosure, the output unit comprises a second pull-up unit, a second pull-down unit, a second output unit and a second control unit, wherein the second pull-up unit has a control terminal connected to the output terminal of the control unit, an input terminal configured to input the second control signal and an output terminal connected to the third node; and the second pull-up unit is configured to output the second control signal to the third node under the control of the output terminal of the control unit;

the second pull-down unit has a control terminal connected to the fourth node, an input terminal configured to input the second reference signal and an output terminal connected to the third node; and the second pull-down unit is configured to output the second reference signal to the third node under the control of the fourth node;

the second output unit has a first control terminal connected to the third node, a second control terminal connected to the fourth node, a first input terminal configured to input the first reference signal, a second input terminal configured to input the second reference signal, a third input terminal configured to input the second reset signal and an output terminal configured to output a signal to the corresponding gate line; and the second output unit is configured to output the first reference signal to the corresponding gate line under the control of the third node and output the second reference signal to the corresponding gate line under the control of the fourth node; and the second control unit has a first control terminal and a first input terminal configured to input the first reference signal, a second control terminal configured to input the second control signal, a third control terminal connected to the third node, a second input terminal configured to input the second reference signal and an output terminal connected to the fourth node; and the second control unit is configured to output the first reference signal to the fourth node under the control of the first reference signal and output the second reference signal to the fourth node under the control of the second control signal or the third node.

According to the embodiments of the present disclosure, the second output unit comprises a third signal output unit and a fourth signal output unit, wherein the third signal output unit has a control terminal connected to the third node, a first input terminal configured to input the first reference signal, a second input terminal configured to input the second reset signal and an output terminal configured to output a signal to the corresponding gate line; and the third signal output unit is configured to output the first reference signal to the corresponding gate line under the control of the third node; and the fourth signal output unit has a control terminal connected to the fourth node, an input terminal configured to input the second reference signal and an output terminal configured to output a signal to the corresponding gate line; and the fourth signal output unit is configured to output the second reference signal to the corresponding gate line under the control of the fourth node.

According to the embodiments of the present disclosure, the third signal output unit comprises a ninth switch transistor, a second capacitor and a third capacitor, wherein the ninth switch transistor has a gate connected to the third node, a source configured to input the first reference signal and a drain configured to output a signal to the corresponding gate line;

the second capacitor is connected between the third node and the drain of the ninth switch transistor; and the third capacitor has one terminal configured to input the second reset signal and the other terminal connected to the third node.

According to the embodiments of the present disclosure, the fourth signal output unit comprises a tenth switch transistor, wherein the tenth switch transistor has a gate connected to the fourth node, a source configured to input the second reference signal and a drain configured to output a signal to the corresponding gate line.

According to the embodiments of the present disclosure, the second pull-up unit comprises an eleventh switch transistor, wherein the eleventh switch transistor has a gate connected to the output terminal of the control unit, a source configured to input the second control signal and a drain connected to the third node.

According to the embodiments of the present disclosure, the second pull-down unit comprises a twelfth switch transistor, wherein the twelfth switch transistor has a gate connected to the fourth node, a source configured to input the second reference signal and a drain connected to the third node.

According to the embodiments of the present disclosure, the second control unit comprises a thirteenth switch transistor, a fourteenth switch transistor and a fifteenth switch transistor, wherein the thirteenth switch transistor has a gate and a source configured to input the first reference signal and a drain connected to the fourth node;

the fourteenth switch transistor has a gate configured to input the second control signal, a source configured to input the second reference signal and a drain connected to the fourth node; and the fifteenth switch transistor has a gate connected to the third node, a source configured to input the second reference signal and a drain connected to the fourth node.

According to the embodiments of the present disclosure, the output unit further comprises a load resistor and a load capacitor, wherein the load resistor has one terminal connected to the output terminal of the output unit and the other terminal connected to one terminal of the load capacitor, and the load capacitor has the other terminal connected to a ground level signal terminal.

According to the embodiments of the present disclosure, a control unit of each of various stages of shift register except for a first stage of shift register and a last stage of shift register has an output terminal configured to input a trigger signal to a first control terminal of a control unit of a next stage of shift register which is adjacent to the current stage of shift register and input a first reset signal to a second control terminal of a control unit of a previous stage of shift register which is adjacent to the current stage of shift register, and an output unit of each of the various stages of shift register except for the first stage of shift register and the last stage of shift register has an output terminal configured to input a trigger signal to a first input terminal and a second control terminal of an output unit of the next stage of shift register which is adjacent to the current stage of shift register and input a second reset signal to a fourth input terminal of an output unit of the previous stage of shift register which is adjacent to the current stage of shift register;

a control unit of the first stage of shift register has an output terminal configured to input a trigger signal to a first control terminal of a control unit of a second stage of shift register, and an output unit of the first stage of shift register has an output terminal configured to input a trigger signal to a first input terminal and a second control terminal of an output unit of the second stage of shift register; and a control unit of the last stage of shift register has an output terminal configured to input a first reset signal to a second control terminal of a control unit of a previous stage of shift register which is adjacent to the last stage of shift register, and an output unit of the last stage of shift register has an output terminal configured to input a second reset signal to a fourth input terminal of an output unit of the previous stage of shift register which is adjacent to the last stage of shift register.

The embodiments of the present disclosure further provide a display panel comprising the above-described gate driving circuit according to the embodiments of the present disclosure.

DETAILED DESCRIPTION

Hereinafter, specific implementations of a gate driving circuit and a display panel according to the embodiments of the present disclosure will be described in detail with reference to the accompanying drawings.

Figure 1:
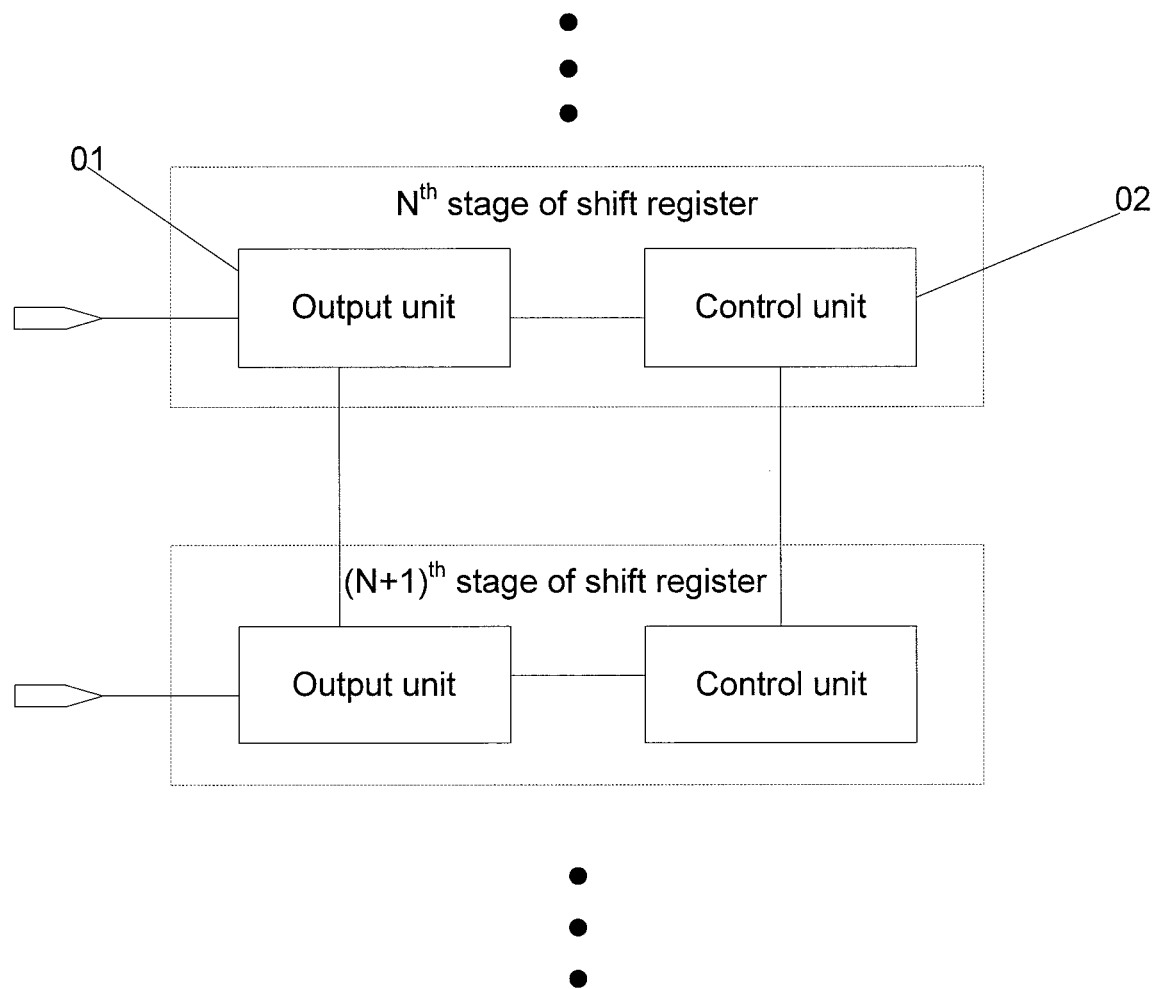
FIGS. 1 and 2 are structural diagrams of gate driving circuits according to an embodiment of the present disclosure, respectively.
Figure 2:
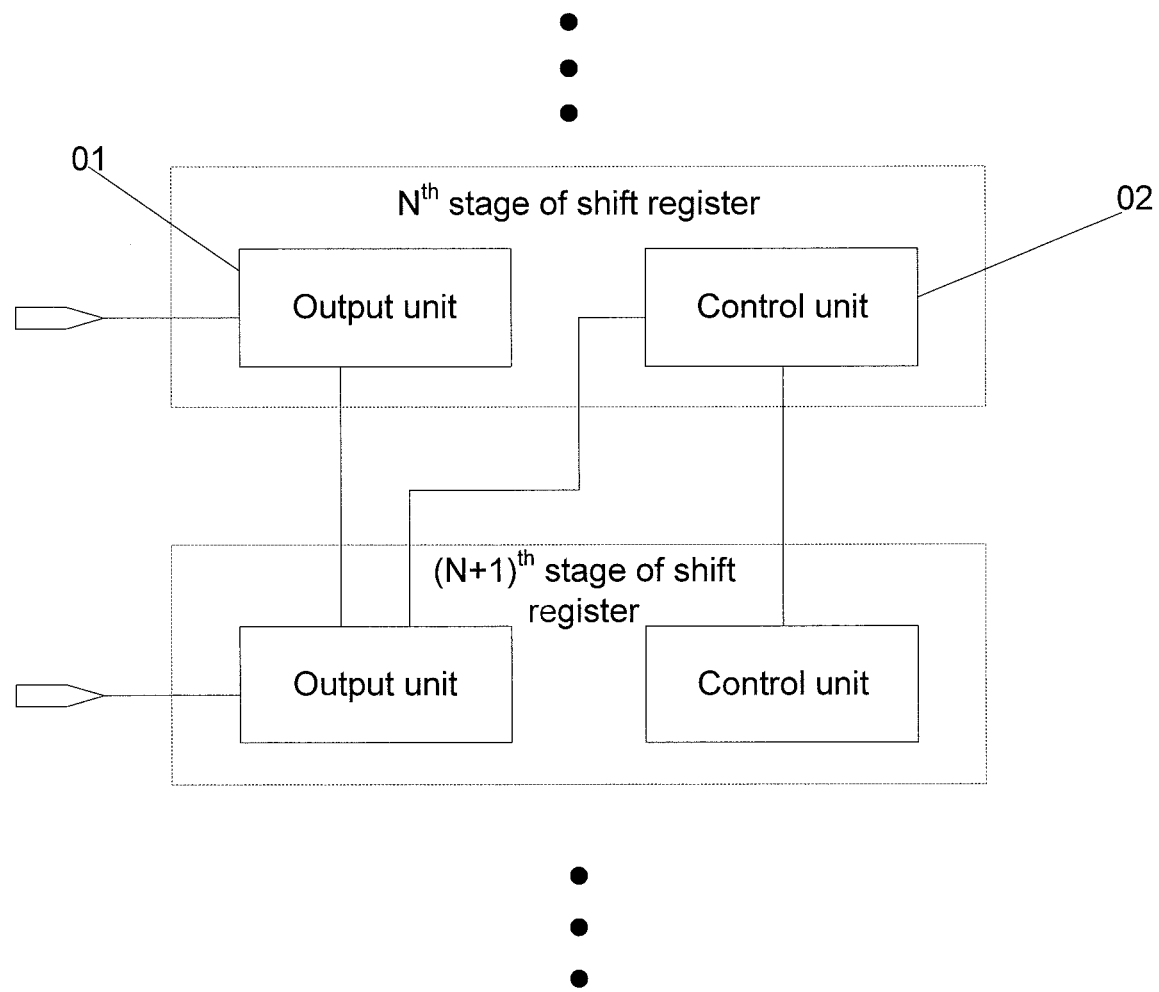

The embodiments of the present disclosure provide a gate driving circuit, comprising a plurality of cascaded shift registers in one-to-one correspondence with gate lines. As shown in FIGS. 1 and 2, each shift register comprises an output unit 01 and a control unit 02. As shown in FIG. 1, an output terminal of a control unit 02 of each of the shift registers is connected to a first control terminal of an output unit 01 of a current stage of shift register, or as shown in FIG. 2, the output terminal of the control unit 02 of each of the shift registers is connected to a first control terminal of an output unit 01 of a next stage of shift register which is adjacent to the current stage of shift register. The control unit 02 is configured to input a dual pulse control signal to the first control terminal of the output unit 01 through the output terminal; and the output unit 01 is configured to output a scanning signal having a pulse width equal to a pulse period of the dual pulse control signal to a corresponding gate line under the control of the dual pulse control signal.

According to an embodiment of the present disclosure, the control unit of the shift register in the gate driving circuit may input a dual pulse control signal to the first control terminal of the output unit. According to an embodiment of the present disclosure, the "dual pulse control signal" refers to two signals output from the output terminal of the control unit to the first control terminal of the output unit at different times, for example, a second reference signal and a clock signal, which substantially constitute a pulse control signal. The output unit outputs a scanning signal having a pulse width equal to a pulse period of the dual pulse control signal to the corresponding gate line under the control of the dual pulse control signal. Thereby, the output unit is controlled by the control unit to output a scanning signal of which a pulse width may be modulated, that is, the pulse width of the scanning signal output from the output unit is modulated by controlling the pulse period of the dual pulse control signal output from the control unit to realize output of a gate signal of which a pulse width may be modulated. In addition, a structure of the shift register in the gate driving circuit according to the embodiments of the present disclosure comprises only the control unit and the output unit, which has a relatively simple structure and require few feedback signals, thereby facilitating realization of a narrow bezel design of a display panel.

Figure 3:
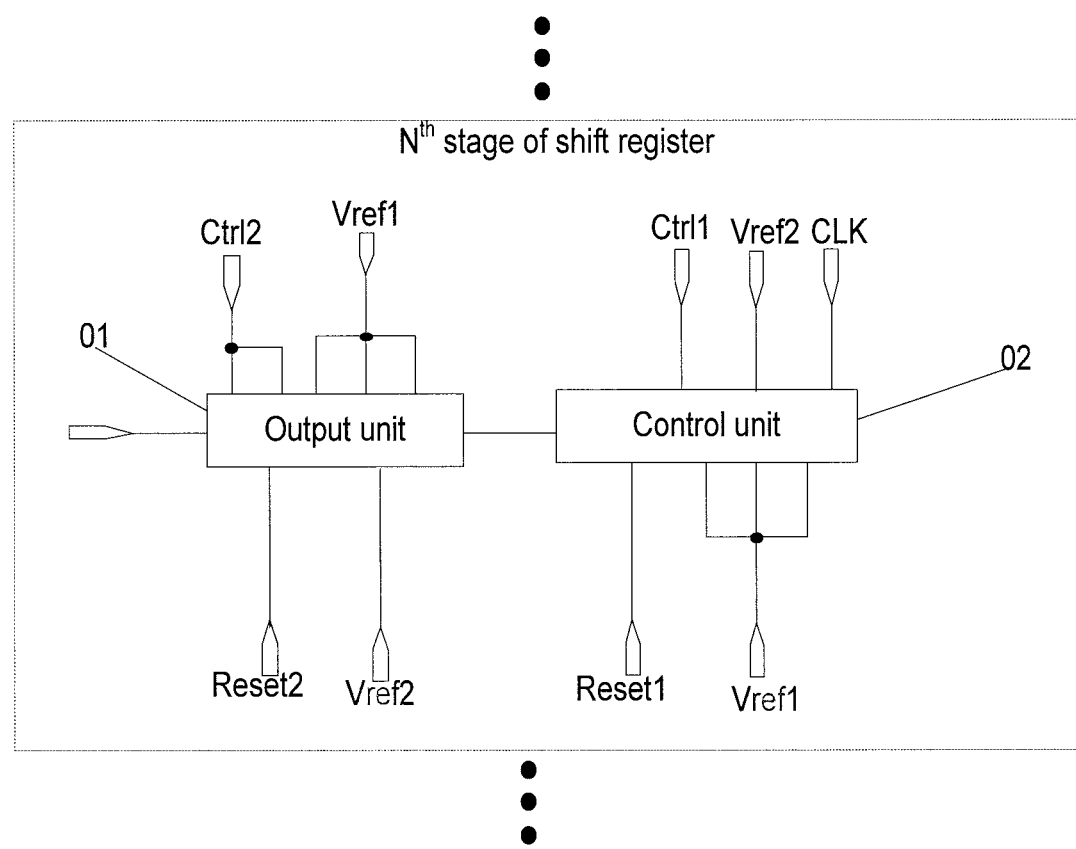
FIGS. 3 to 5 are structural diagrams of shift registers in gate driving circuits according to an embodiment of the present disclosure, respectively.
Figure 4:
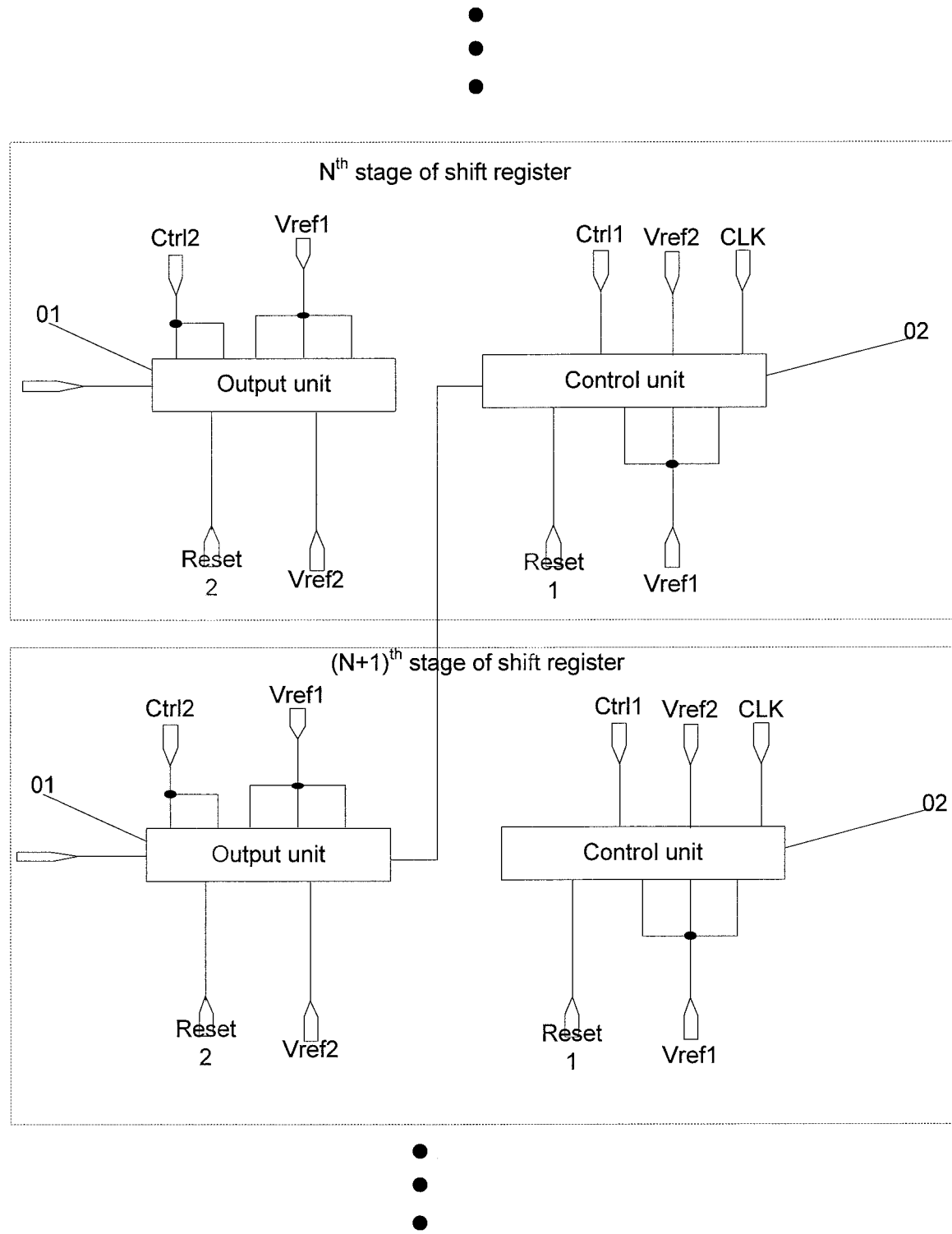

As shown in FIGS. 3 and 4, the control unit 02 has a first control terminal configured to input a first control signal Ctrl1, a second control terminal configured to input a first reset signal Reset1, a third control terminal, a first input terminal and a second input terminal configured to input a first reference signal Vref1, a third input terminal configured to input a second reference signal Vref2, a fourth input terminal configured to input a clock signal CLK and an output terminal connected to the first control terminal of the output unit 01. As shown in FIG. 3, the output terminal of the control unit is connected to the first control terminal of the output unit of the current stage of shift register. As shown in FIG. 4, the output terminal of the control unit is connected to the first control terminal of the output unit of the next stage of shift register adjacent to the current stage of shift register. The control unit 02 is configured to output the second reference signal Vref2 or the clock signal CLK to the first control terminal of the output unit 01 under the control of the first control signal Ctrl1, the first reset signal Reset1 and the first reference signal Vref1.

The output unit 01 has a second control terminal and a first input terminal configured to input a second control signal Ctrl2, a third control terminal, a second input terminal and a third input terminal configured to input the first reference signal Vref1, a fourth input terminal configured to input a second reset signal Reset2, a fifth input terminal configured to input the second reference signal Vref2, and an output terminal configured to output a signal to the corresponding gate line. The output unit 01 is configured to output the first reference signal Vref1 or the second reference signal Vref2 to the corresponding gate line under the control of the output terminal of the control unit 02, the first reference signal Vref1 and the second control signal Ctrl1.

For example, the control unit outputs the second reference signal or the clock signal under the control of the first control signal, the first reset signal and the first reference signal to form a dual pulse control signal and outputs the dual pulse control signal to the first control terminal of the output unit; and the output unit outputs the first reference signal or the second reference signal under the control of the dual pulse control signal, the first reference signal and the second control signal to form a scanning signal having a pulse width equal to a pulse period of the dual pulse control signal and outputs the scanning signal to a corresponding gate line. In this way, the output unit can be controlled by the control unit to output a scanning signal of which a pulse width may be modulated, that is, the pulse width of the scanning signal output from the output unit is modulated by controlling the pulse period of the dual pulse control signal output from the control unit, to realize output of a gate signal of which a pulse width may be modulated.

Figure 5:
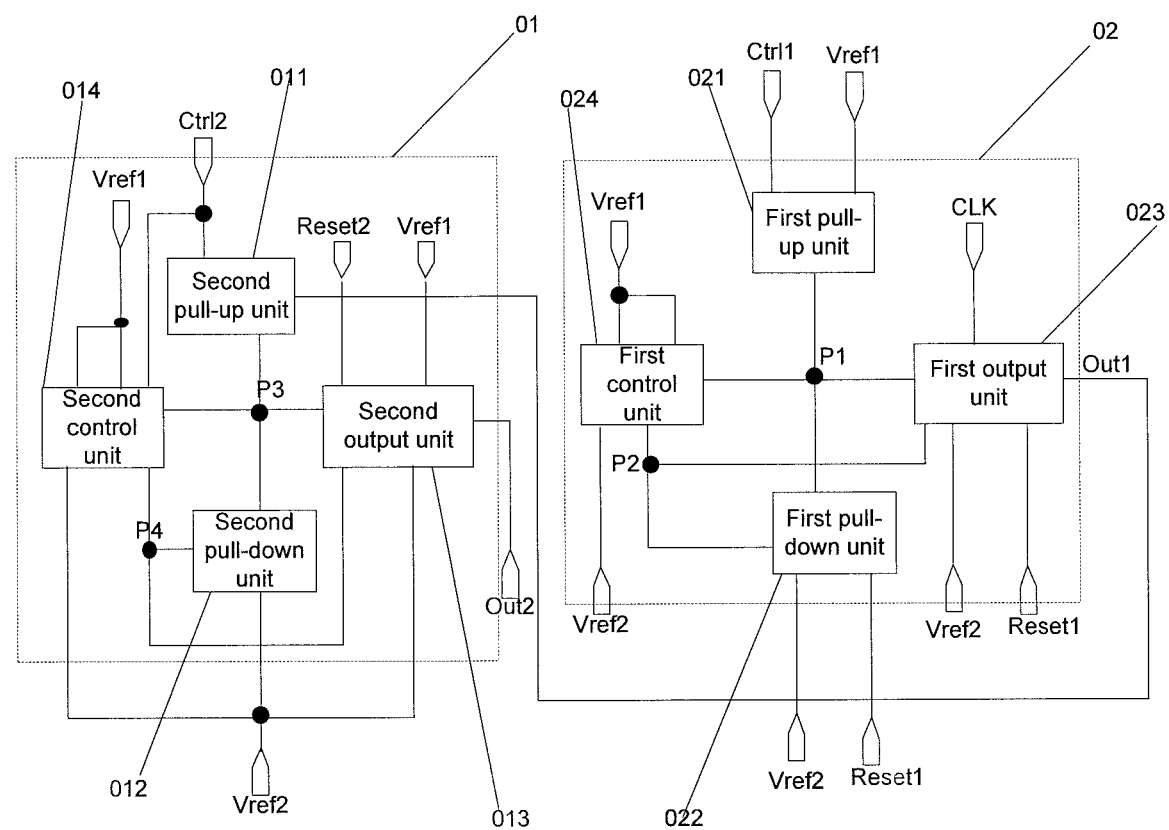

As shown in FIG. 5, the control unit 02 may comprise a first pull-up unit 021, a first pull-down unit 022, a first output unit 023 and a first control unit 024. The first pull-up unit 021 has a control terminal configured to input the first control signal Ctrl1, an input terminal configured to input the first reference signal Vref1 and an output terminal connected to the first node P1; and the first pull-up unit 021 is configured to output the first reference signal Vref1 to the first node P1 under the control of the first control signal Ctrl1. The first pull-down unit 022 has a first control terminal connected to the second node P2, a second control terminal configured to input the first reset signal Reset1, an input terminal configured to input the second reference signal Vref2 and an output terminal connected to the first node P1; and the first pull-down unit 022 is configured to output the second reference signal Vref2 to the first node P1 under the control of the second node P2 or the first reset signal Reset1. The first output unit 023 has a first control terminal connected to the first node P1, a second control terminal configured to input the first reset signal Reset1, a third control terminal connected to the second node P2, a first input terminal configured to input the clock signal CLK, a second input terminal configured to input the second reference signal Vref2 and an output terminal connected to the first control terminal of the output unit 01; and the first output unit 023 is configured to output the clock signal CLK to the first control terminal of the output unit 01 under the control of the first node P1, and output the second reference signal Vref2 to the first control terminal of the output unit 01 under the control of the second node P2 or the first reset signal Reset1. The first control unit 024 has a first control terminal and a first input terminal configured to input the first reference signal Vref1, a second control terminal connected to the first node P1, a second input terminal configured to input the second reference signal Vref2 and an output terminal connected to the second node P2; and the first control unit 024 is configured to output the first reference signal Vref1 to the second node P2 under the control of the first reference signal Vref1 and output the second reference signal Vref2 to the second node P2 under the control of the first node P1.

For example, the control unit may comprise a first pull-up unit, a first pull-down unit, a first output unit and a first control unit; wherein the first pull-up unit is configured to output the first reference signal to the first node, so as to pull up a potential at the first node; and the first pull-down unit is configured to output the second reference signal to the first node to pull down the potential at the first node. The first output unit is configured to output the clock signal or the second reference signal to the first control terminal of the output unit to form a dual pulse control signal; and the first control unit is configured to output the first reference signal to the second node under the control of the first reference signal, and output the second reference signal to the second node under the control of the first node, so as to realize control of a potential at the second node.

Figure 6:
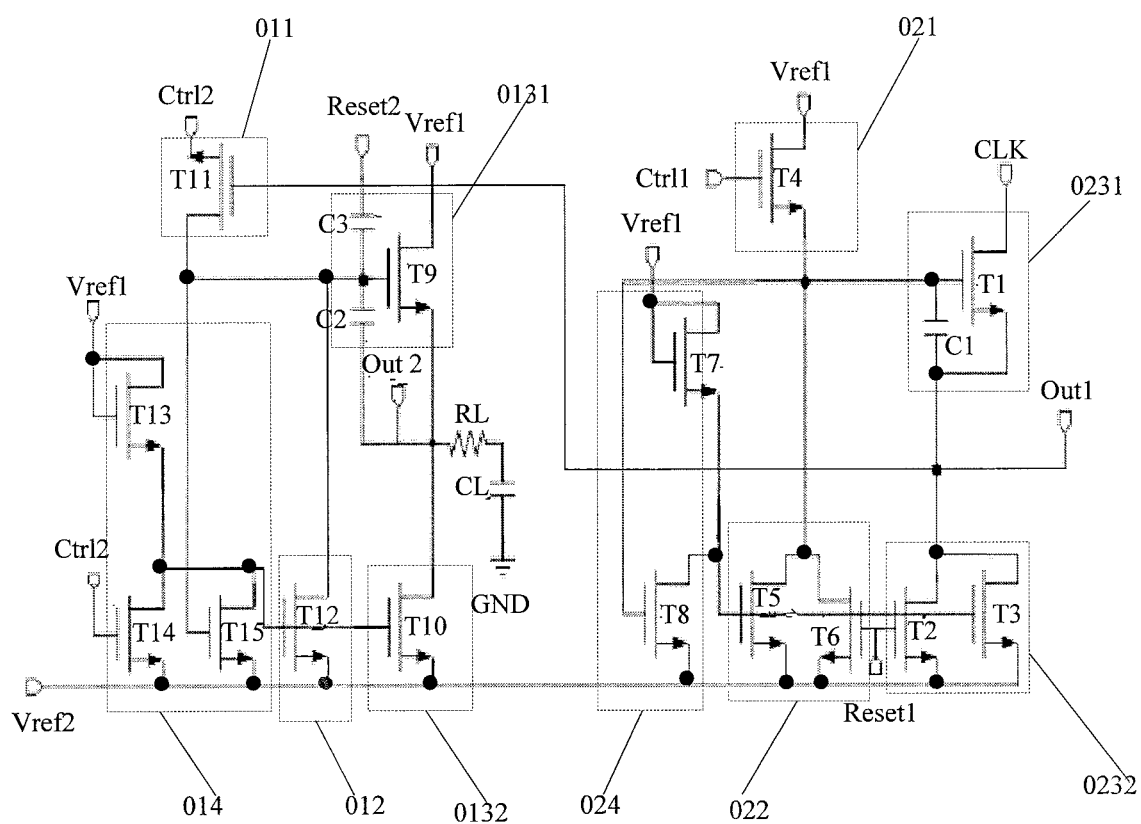
FIG. 6 is an exemplary structural diagram of a shift register in a gate driving circuit according to an embodiment of the present disclosure.

As shown in FIG. 6, the first output unit 023 may comprise a first signal output unit 0231 and a second signal output unit 0232. The first signal output unit 0231 has a control terminal connected to the first node P1, an input terminal configured to input the clock signal CLK and an output terminal connected to the first control terminal of the output unit 01; and the first signal output unit 0231 is configured to output the clock signal CLK to the first control terminal of the output unit 01 under the control of the first node P1. The second signal output unit 0232 has a first control terminal configured to input the first reset signal Reset1, a second control terminal connected to the second node P2, an input terminal configured to input the second reference signal Vref2, and an output terminal connected to the first control terminal of the output unit 01; and the second signal output unit 0232 is configured to output the second reference signal Vref2 to the first control terminal of the output unit 01 under the control of the second node P2 or the first reset signal Reset1.

For example, the first output unit may comprise a first signal output unit and a second signal output unit, both of which are configured to output the clock signal and the second reference signal to form a dual pulse control signal and output the dual pulse control signal to the first control terminal of the output unit.

As shown in FIG. 6, the first signal output unit 0231 may comprise a first switch transistor T1 and a first capacitor C1, wherein the first switch transistor T1 has a gate connected to the first node P1, a source configured to input the clock signal CLK and a drain connected to the first control terminal of the output unit 01; and the first capacitor C1 is connected between the first node P1 and the first control terminal of the output unit 01. Specifically, the first switch transistor may be turned on under the control of the first node, and the first switch transistor which is turned on may output the clock signal to the first control terminal of the output unit.

As shown in FIG. 6, the second signal output unit 0232 may comprise a second switch transistor T2 and a third switch transistor T3, wherein the second switch transistor T2 has a gate configured to input the first reset signal Reset1, a source configured to input the second reference signal Vref2 and a drain connected to the first control terminal of the output unit 01; and the third switch transistor T3 has a gate connected to the second node P2, a source configured to input the second reference signal Vref2 and a drain connected to the first control terminal of the output unit 01. Specifically, the second switch transistor may be turned on under the control of the first reset signal, and the second switch transistor which is turned on may output the second reference signal to the first control terminal of the output unit; and the third switch transistor may be turned on under the control of the second node, and the third switch transistor which is turned on may output the second reference signal to the first control terminal of the output unit.

As shown in FIG. 6, the first pull-up unit 021 may comprise a fourth switch transistor T4, wherein the fourth switch transistor T4 has a gate configured to input the first control signal Ctrl1, a source configured to input the first reference signal Vref1 and a drain connected to the first node P1. Specifically, the fourth switch transistor may be turned on under the control of the first control signal, and the fourth switch transistor which is turned on may output the first reference signal to the first node.

As shown in FIG. 6, the first pull-down unit 022 may comprise a fifth switch transistor T5 and a sixth switch transistor T6, wherein the fifth switch transistor T5 has a gate connected to the second node P2, a source configured to input the second reference signal Vref2 and a drain connected to the first node P1; and the sixth switch transistor T6 has a gate configured to input the first reset signal Reset1, a source configured to input the second reference signal Vref2 and a drain connected to the first node P1. Specifically, the fifth switch transistor may be turned on under the control of the second node, and the fifth switch transistor which is turned on may output the second reference signal to the first node; and the sixth switch transistor may be turned on under the control of the first reset signal, and the sixth switch transistor which is turned on may output the second reference signal to the first node.

As shown in FIG. 6, the first control unit 024 may comprise a seventh switch transistor T7 and an eighth switch transistor T8, wherein the seventh switch transistor T7 has a gate and a source configured to input the first reference signal Vref1 and a drain connected to the second node P2; and the eighth switch transistor T8 has a gate connected to the first node P1, a source configured to input the second reference signal Vref2 and a drain connected to the second node P2. Specifically, the seventh switch transistor may be turned on under the control of the first reference signal Vref1, and the seventh switch transistor which is turned on may output the first reference signal to the second node; and the eighth switch transistor may be turned on under the control of the first node, and the eighth switch transistor which is turned on may output the second reference signal to the second node.

As shown in FIG. 5, the output unit 01 may comprise a second pull-up unit 011, a second pull-down unit 012, a second output unit 013 and a second control unit 014. The second pull-up unit 011 has a control terminal connected to the output terminal Out1 of the control unit 02, an input terminal configured to input the second control signal Ctrl2 and an output terminal connected to the third node P3; and the second pull-up unit 011 is configured to output the second control signal Ctrl2 to the third node P3 under the control of the output terminal Out1 of the control unit 02. The second pull-down unit 012 has a control terminal connected to the fourth node P4, an input terminal configured to input the second reference signal Vref2 and an output terminal connected to the third node P3; and the second pull-down unit 012 is configured to output the second reference signal Vref2 to the third node P3 under the control of the fourth node P4. The second output unit 013 has a first control terminal connected to the third node P3, a second control terminal connected to the fourth node P4, a first input terminal configured to input the first reference signal Vref1, a second input terminal configured to input the second reference signal Vref2, a third input terminal configured to input the second reset signal Reset2 and an output terminal Out2 configured to output a signal to the corresponding gate line; and the second output unit 013 is configured to output the first reference signal Vref1 to the corresponding gate line under the control of the third node P3 and output the second reference signal Vref2 to the corresponding gate line under the control of the fourth node P4. The second control unit 014 has a first control terminal and a first input terminal configured to input the first reference signal Vref1, a second control terminal configured to input the second control signal Ctrl2, a third control terminal connected to the third node P3, a second input terminal configured to input the second reference signal Vref2 and an output terminal connected to the fourth node P4; and the second control unit 014 is configured to output the first reference signal Vref1 to the fourth node P4 under the control of the first reference signal Vref1 and output the second reference signal Vref2 to the fourth node P4 under the control of the second control signal Ctrl2 or the third node P3.

For example, the output unit may comprise a second pull-up unit, a second pull-down unit, a second output unit, and a second control unit; wherein the second pull-up unit is configured to output the second control signal to the third node; the second pull-down unit is configured to output the second reference signal to the third node, so that control of a potential at the third node is realized through the second pull-up unit and the second pull-down unit. The second output unit is configured to output the first reference signal to the corresponding gate line under the control of the third node and output the second reference signal to the corresponding gate line under the control of the fourth node, so as to realize output of a scanning signal of which a pulse width may be modulated. The second control unit is configured to output the first reference signal to the fourth node under the control of the first reference signal and output the second reference signal to the fourth node under the control of the second control signal or the third node, so as to realize control of a potential at the fourth node.

As shown in FIG. 6, the second output unit 013 may comprise a third signal output unit 0131 and a fourth signal output unit 0132, wherein the third signal output unit 0131 has a control terminal connected to the third node P3, a first input terminal configured to input the first reference signal Vref1, a second input terminal configured to input the second reset signal Reset2 and an output terminal Out2 configured to output a signal to the corresponding gate line; and the third signal output unit 0131 is configured to output the first reference signal Vref1 to the corresponding gate line under the control of the third node P3; and the fourth signal output unit 0132 has a control terminal connected to the fourth node P4, an input terminal configured to input the second reference signal Vref2 and an output terminal Out2 configured to output a signal to the corresponding gate line; and the fourth signal output unit 0132 is configured to output the second reference signal Vref2 to the corresponding gate line under the control of the fourth node P4.

For example, the second output unit may comprise a third signal output unit and a fourth signal output unit, both of which output the first reference signal and the second reference signal under the control of corresponding control terminals, respectively, to finally output a scanning signal having a pulse width equal to a period of a dual pulse control signal.

As shown in FIG. 6, the third signal output unit 0131 may comprise a ninth switch transistor T9, a second capacitor C2 and a third capacitor C3, wherein the ninth switch transistor T9 has a gate connected to the third node P3, a source configured to input the first reference signal Vref1 and a drain (i.e., the output terminal Out2) configured to output a signal to the corresponding gate line; the second capacitor C2 is connected between the third node P3 and the drain of the ninth switch transistor T9; and the third capacitor C3 has one terminal configured to input the second reset signal Reset2 and the other terminal connected to the third node P3. Specifically, in the gate driving circuit according to the embodiments of the present disclosure, the ninth switch transistor may be turned on under the control of the third node, and the ninth switch transistor which is turned on may output the first reference signal through the drain; and the second capacitor and the third capacitor can maintain or change the potential at the third node through coupling.

As shown in FIG. 6, the fourth signal output unit may comprise a tenth switch transistor T10, wherein the tenth switch transistor T10 has a gate connected to the fourth node P4, a source configured to input the second reference signal Vref2 and a drain configured to output a signal to the corresponding gate line. Specifically, in the gate driving circuit according to the embodiments of the present disclosure, the tenth switch transistor may be turned on under the control of the fourth node, and the tenth switch transistor which is turned on may output the second reference signal through the drain.

As shown in FIG. 6, the second pull-up unit 011 may comprise an eleventh switch transistor T11, wherein the eleventh switch transistor T11 has a gate connected to the output terminal Out1 of the control unit 02, a source configured to input the second control signal Ctrl2 and a drain connected to the third node P3. Specifically, the eleventh switch transistor may be turned on under the control of the output terminal of the control unit, and the eleventh switch transistor which is turned on may output the second control signal to the third node.

As shown in FIG. 6, the second pull-down unit 012 may comprise a twelfth switch transistor T12, wherein the twelfth switch transistor T12 has a gate connected to the fourth node P4, a source configured to input the second reference signal Vref2 and a drain connected to the third node P3. Specifically, the twelfth switch transistor may be turned on under the control of the fourth node, and the twelfth switch transistor which is turned on may output the second reference signal to the third node.

For example, the second control unit 014 may comprise a thirteenth switch transistor T13, a fourteenth switch transistor T14 and a fifteenth switch transistor T15, wherein the thirteenth switch transistor T13 has a gate and a source configured to input the first reference signal Vref1 and a drain connected to the fourth node P4; the fourteenth switch transistor T14 has a gate configured to input the second control signal Ctrl2, a source configured to input the second reference signal Vref2 and a drain connected to the fourth node P4; and the fifteenth switch transistor T15 has a gate connected to the third node P3, a source configured to input the second reference signal Vref2 and a drain connected to the fourth node P4. Specifically, the thirteenth switch transistor may be turned on under the control of the first reference signal, and the thirteenth switch transistor which is turned on may output the first reference signal to the fourth node; the fourteenth switch transistor may be turned on under the control of the second control signal, and the fourteenth switch transistor which is turned on may output the second reference signal to the fourth node; and the fifteenth switch transistor may be turned on under the control of the third node, and the fifteenth switch transistor which is turned on may output the second reference signal to the fourth node.

As shown in FIG. 6, the output unit further comprises a load resistor RL and a load capacitor CL, wherein the load resistor RL has one terminal connected to the output terminal Out2 of the output unit and the other terminal connected to one terminal of the load capacitor CL, and the load capacitor CL has the other terminal connected to a ground level signal terminal GND.

It should be noted that the switch transistors mentioned in the above embodiments of the present disclosure may be Thin Film Transistors (TFTs) or Metal Oxide Semiconductor (MOS) field effect transistors. The present disclosure is not limited thereto. In specific implementations, a source and a drain of each of the transistors may be interchangeable, and are not specifically distinguished. In describing a specific embodiment, a thin film transistor is used as an example.

Figure 7:
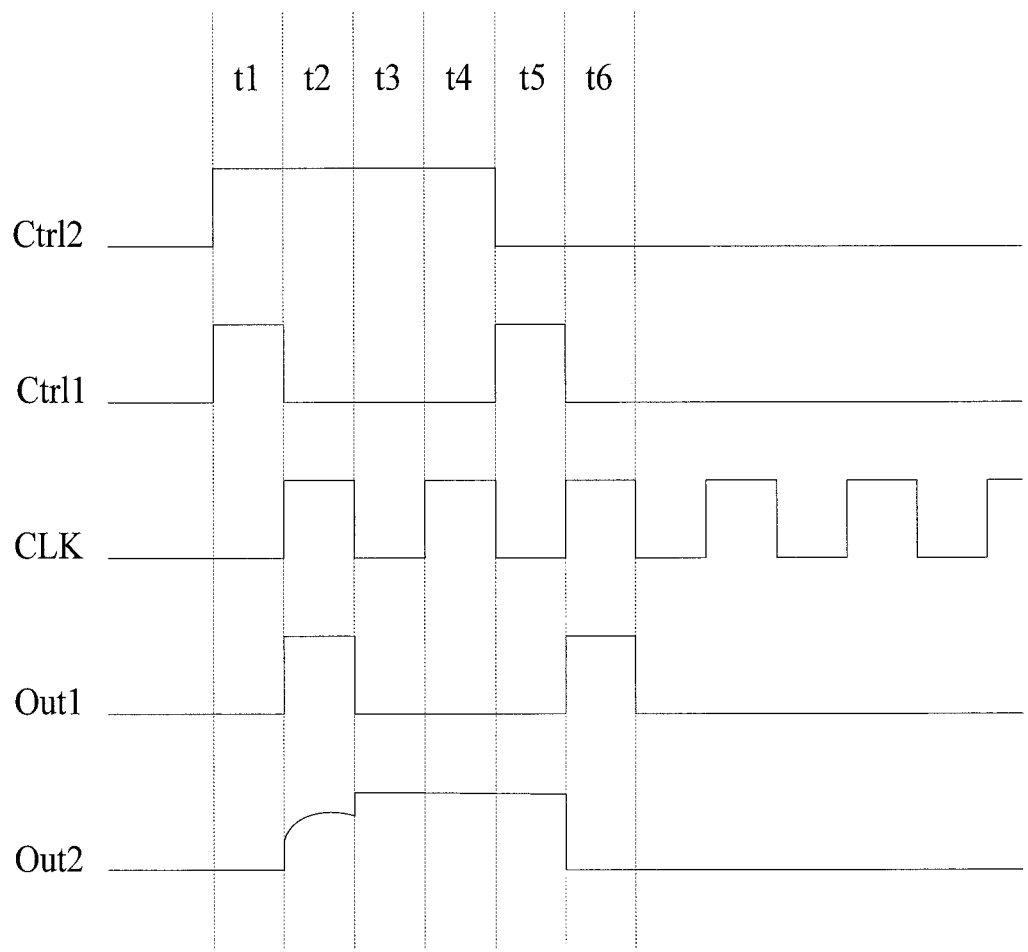
FIG. 7 is an operational timing diagram of the shift register shown in FIG. 6 according to an embodiment of the present disclosure.

An operation process of the shift register according to the embodiments of the present disclosure will be described below in conjunction with the shift register shown in FIG. 6 and the input/output timing diagram shown in FIG. 7. Specifically, six phases t1-t6 in the input/output timing diagram shown in FIG. 7 are selected. In the following description, 1 represents a high level signal, and 0 represents a low level signal.

In the phase t1, Ctrl1=1, Ctrl2=1, CLK=0, Reset1=0, Reset2=0, Vref1=1 and Vref2=0. As Ctrl1=1, the fourth switch transistor T4 is turned on and the fourth switch transistor T4 which is turned on outputs the first reference signal Vref1 to the first node P1. As Vref1=1, the first switch transistor T1 is turned on and the first switch transistor T1 which is turned on outputs the clock signal CLK to the gate of the eleventh switch transistor T11 through the output terminal Out1. As CLK=0, the eleventh switch transistor T11 is turned off. In this phase, the thirteenth switch transistor T13 is turned on under the control of the first reference signal Vref1 and outputs the first reference signal Vref1 to the fourth node P4 so that the tenth switch transistor T10 and the twelfth switch transistor T12 are turned on, and the twelfth switch transistor T12 which is turned on outputs the second reference signal Vref2 to the third node P3, to pull down the potential at the third node P3 so that the ninth switch transistor T9 and the fifteenth switch transistor T15 are in a turn-off state. The tenth switch transistor T10 which is turned on outputs the second reference signal Vref2 through the output terminal Out2.

In the phase t2, Ctrl1=0, Ctrl2=1, CLK=1, Reset1=0, Reset2=0, Vref1=1 and Vref2=0. As the first node 1 is at a high level in the previous phase, Ctrl1=0 in the current phase. Therefore, the fourth switch transistor T4 is turned off, CLK=1, the clock signal jumps from a low level to a high level, the potential at the first node P1 is further pulled up through a boosting function of the first capacitor C1, therefore the first switch transistor T1 continues to be turned on, and the first switch transistor T1 which is turned on outputs the clock signal CLK to the gate of the eleventh switch transistor T11. As CLK=1, the eleventh switch transistor T11 is turned on, Ctrl2=1 at this time, and the eleventh switch transistor T11 which is turned on outputs the second control signal Ctrl2 to the third node P3. Thereby, the ninth switch transistor T9 and the fifteenth switch transistor T15 are in a turned on state, and the fifteenth switch transistor T15 which is turned on outputs the second reference signal Vref2 to the fourth node P4 while the fourteenth switch transistor T14 which is turned on also further pulls down the potential at the fourth node P4. The ninth switch transistor T9 which is turned on causes the output terminal Out2 to output a high level.

In the phase t3, Ctrl1=0, Ctrl2=1, CLK=0, Reset1=1, Reset2=1, Vref1=1, and Vref2=0. As Reset1=1, the second switch transistor T2 and the sixth switch transistor T6 are turned on. The sixth switch transistor T6 which is turned on outputs the second reference signal Vref2 to the first node P1, to pull down the potential at the first node P1, so that the first switch transistor T1 and the eighth switch transistor T8 are turned off. The eighth switch transistor T8 is in a turned off state, and then the potential at the second node P2 is pulled up by the seventh switch transistor T7 which is turned on. Therefore, the fifth switch transistor T5 and the third switch transistor T3 are turned on. The fifth switch transistor T5 which is turned on further pulls down the potential at the first node P1. The second switch transistor and the third switch transistor which are turned on pull down the potential at the output terminal Out1 simultaneously, so that the output terminal OUT1 outputs a low level to the gate of the eleventh switch transistor T11, and the eleventh switch transistor T11 is turned off.

As Ctrl2=1, the fourteenth switch transistor T14 is turned on and the fourteenth switch transistor T14 which is turned on pulls down the potential at the fourth node P4 so that the tenth switch transistor tT10 and the twelfth switch transistor T12 are turned off. At this time, the third node P3 maintains a high potential in the previous phase, and therefore the ninth switch transistor T9 and the fifteenth switch transistor T15 are in a turned-on state. The fifteenth switch transistor T15 which is turned on outputs the second reference signal Vref2 to the fourth node P4 to pull down the potential at the fourth node P4. At the same time, Reset2=1, the potential at the third node P3 is further pulled up through coupling of the third capacitor C3, so that the ninth switch transistor T9 is fully turned on, and the ninth switch transistor T9 reaches the first reference signal Vref1 through the high level output from the output terminal Out2.

In the phase t4, Ctrl1=0, Ctrl2=1, CLK=1, Reset1=0, Reset2=1, Vref1=1 and Vref2=0. As Ctrl1=0, the fourth switch transistor T4 is turned off. As Reset1=0, the second switch transistor T2 and the sixth switch transistor T6 are turned off. The first node P1 maintains a low potential in the previous phase, and therefore the first switch transistor T1 and the eighth switch transistor T8 are turned off. As the eighth switch transistor T8 is turned off, the potential at the second node P2 is pulled up by the seventh switch transistor T7 which is turned on so that the third switch transistor T3 and the fifth switch transistor T5 are turned on. The potential at the first node P1 is further pulled down by the fifth switch transistor T5 which is turned on, and the third switch transistor T3 which is turned on outputs the second reference signal Vref2 to the gate of the eleventh switch transistor T11 through the output terminal OUT1, and therefore the eleventh switch transistor T11 is turned off.

As Ctrl2=1, the fourteenth switch transistor T14 is turned on to pull down the potential at the fourth node P4 so that the tenth switch transistor T10 and the twelfth switch transistor T12 are turned off. At this time, the third node maintains a high potential in the previous phase, so that the ninth switch transistor T9 and the fifteenth switch transistor T15 are in a turned-on state. The fifteenth switch transistor T15 which is turned on outputs the second reference signal Vref2 to the fourth node P4 to pull down the potential at the fourth node P4. The ninth switch transistor T9 which is turned on outputs the first reference signal Vref1 through the output terminal Out2.

In the phase t5, Ctrl1=1, Ctrl2=0, CLK=0, Reset1=0, Reset2=1, Vref1=1 and Vref2=0. As Ctrl1=1, the fourth switch transistor T4 is turned on and the fourth switch transistor T4 which is turned on outputs the first reference signal Vref1 to the first node P1. As Vref1=1, the first switch transistor T1 and the eighth switch transistor T8 are turned on. The first switch transistor T1 which is turned on outputs the clock signal CLK to the gate of the eleventh switch transistor T11 through the output terminal Out1. As CLK=0, the eleventh switch transistor T11 is turned off. The eighth switch transistor T8 which is turned on outputs the second reference signal Vref2 to the second node P2 so that the third switch transistor T3 and the fifth switch transistor T5 are turned off. As reset1=0, the second switch transistor T2 and the sixth switch transistor T6 are turned off.

As Ctrl2=0, the fourteenth switch transistor T14 is turned off. In this phase, the third node P3 maintains a high potential in the previous phase so that the ninth switch transistor T9 and the fifteenth switch transistor T15 are in a turned-on state. The fifteenth switch transistor T15 which is turned on outputs the second reference signal Vref2 to the fourth node P4 to pull down the potential at the fourth node P4 so that the tenth switch transistor T10 and the twelfth switch transistor T12 are turned off. The ninth switch transistor T9 which is turned on outputs the first reference signal Vref1 through the output terminal Out2.

In the phase t6, Ctrl1=0, Ctrl2=0, CLK=1, Reset1=0, Reset2=1, Vref1=1 and Vref2=0. As Ctrl1=0, the fourth switch transistor T4 is turned off, and the first node P1 maintains a high potential in the previous phase. Therefore, the first switch transistor T1 and the eighth switch transistor T8 are turned on. The first switch transistor T1 which is turned on outputs the clock signal CLK to the gate of the eleventh switch transistor T11 through the output terminal Out1. As CLK=1, the eleventh switch transistor T11 is turned on. The eighth switch transistor T8 which is turned on outputs the second reference signal Vref2 to the second node P2 so that the third switch transistor T3 and the fifth switch transistor T5 are turned off.

The eleventh switch transistor T11 which is turned on outputs the second control signal Ctrl2 to the third node P3, and as Ctrl2=0, the potential at the third node P3 is pulled down so that the ninth switch transistor T9 and the fifteenth switch transistor T15 are in a turned-off state. At the same time, as Ctrl2=0, the fourteenth switch transistor T14 is turned off, the potential at the fourth node P4 is pulled up by the thirteenth switch transistor T13 which is turned on, and therefore the tenth switch transistor T10 and the twelfth switch transistor T12 are turned on. The twelfth switch transistor T12 which is turned on further pulls down the potential at the third node P3. The tenth switch transistor T10 which is turned on outputs the second reference signal Vref2 through the output terminal Out2.

Figure 8:
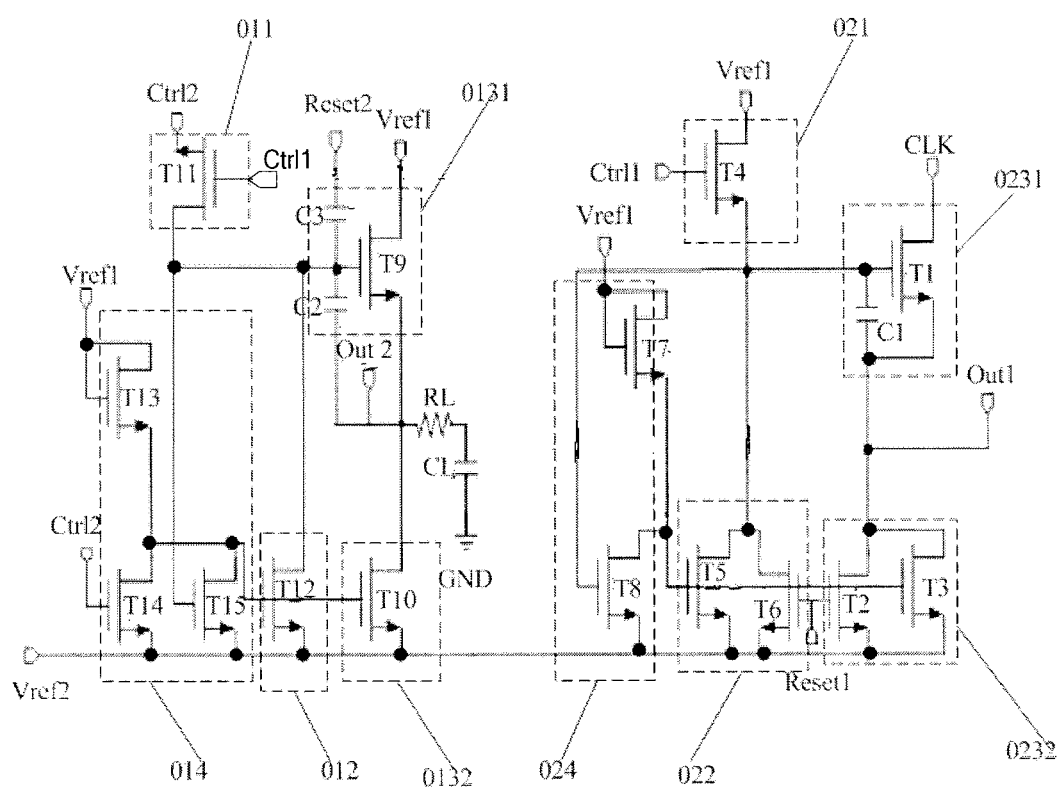
FIG. 8 is another structural diagram of a shift register in a gate driving circuit according to an embodiment of the present disclosure.
Figure 9:
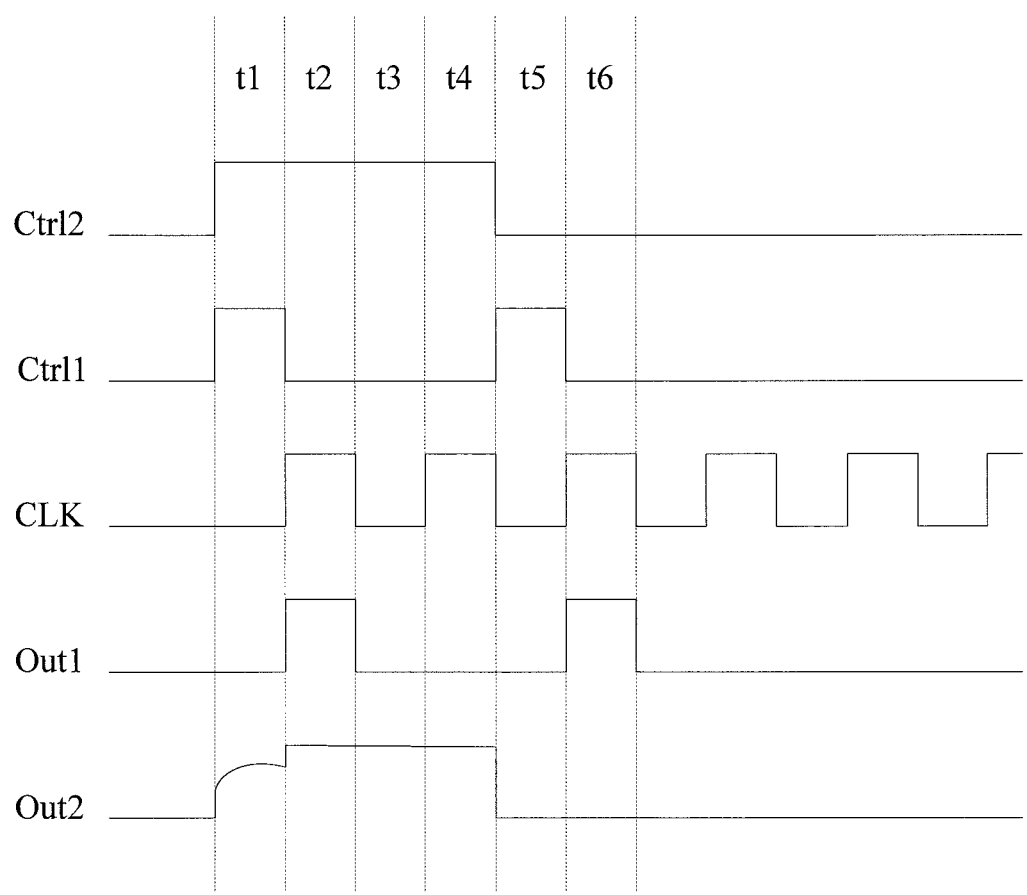
FIG. 9 is an operational timing diagram of the shift register shown in FIG. 8 according to an embodiment of the present disclosure.

It should be noted that the switch transistors in the above embodiments are described by taking N-type transistors and an output terminal of a control unit of a current stage of shift register being connected to a first control terminal of an output unit of the current stage of shift register as an example. As shown in FIG. 8, illustrated is a structural diagram of a shift register in which an output terminal of a control unit of a current stage of shift register is connected to a first control terminal of an output unit of a next stage of shift register adjacent to the current stage of shift register. Specifically, in the structure of the shift register shown in FIG. 8, a control signal input by a gate of an eleventh switch transistor T11 is a signal output from an output terminal Out1 of a previous stage of shift register. FIG. 9 illustrates an input/output timing diagram of the structure of the shift register shown in FIG. 8, and an operation principle of the shift register shown in FIG. 8 is similar to that of the shift register shown in FIG. 6, and is not described here in detail.

In a specific implementation, in the gate driving circuit according to the embodiments of the present disclosure, a control unit of each of various stages of shift register except for a first stage of shift register and a last stage of shift register has an output terminal configured to input a trigger signal to a first control terminal of a control unit of a next stage of shift register which is adjacent to the current stage of shift register and input a first reset signal to a second control terminal of a control unit of a previous stage of shift register which is adjacent to the current stage of shift register, and an output unit of each of the various stages of shift register except for the first stage of shift register and the last stage of shift register has an output terminal configured to input a trigger signal to a first input terminal and a second control terminal of an output unit of the next stage of shift register which is adjacent to the current stage of shift register and input a second reset signal to a fourth input terminal of an output unit of the previous stage of shift register which is adjacent to the current stage of shift register;

a control unit of the first stage of shift register has an output terminal configured to input a trigger signal to a first control terminal of a control unit of a second stage of shift register, and an output unit of the first stage of shift register has an output terminal configured to input a trigger signal to a first input terminal and a second control terminal of an output unit of the second stage of shift register; and a control unit of the last stage of shift register has an output terminal configured to input a first reset signal to a second control terminal of a control unit of a previous stage of shift register which is adjacent to the last stage of shift register, and an output unit of the last stage of shift register has an output terminal configured to input a second reset signal to a fourth input terminal of an output unit of the previous stage of shift register which is adjacent to the last stage of shift register.

Figure 10:
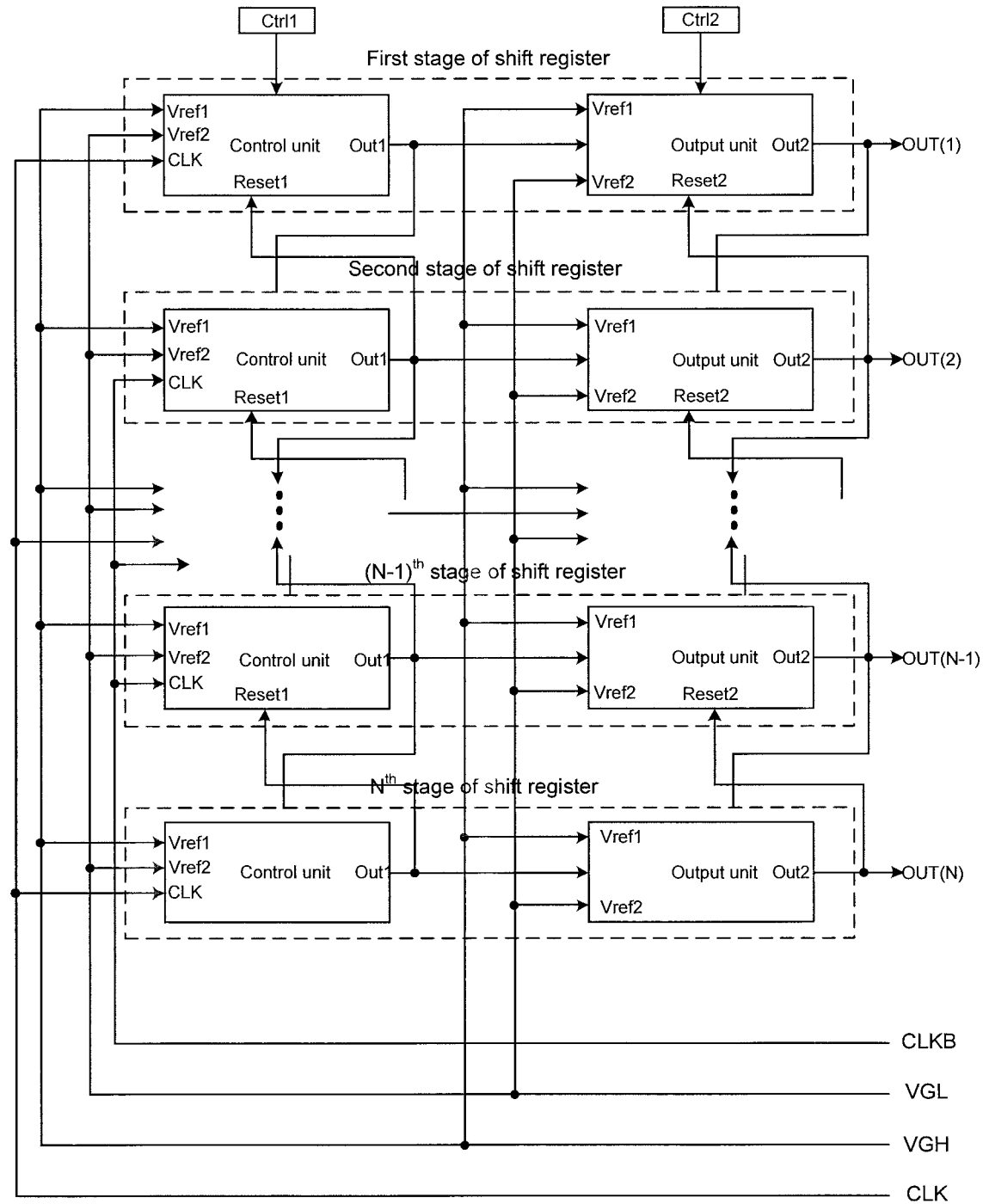
FIGS. 10 and 11 are diagrams of cascaded gate driving circuits according to an embodiment of the present disclosure, respectively.
Figure 11:
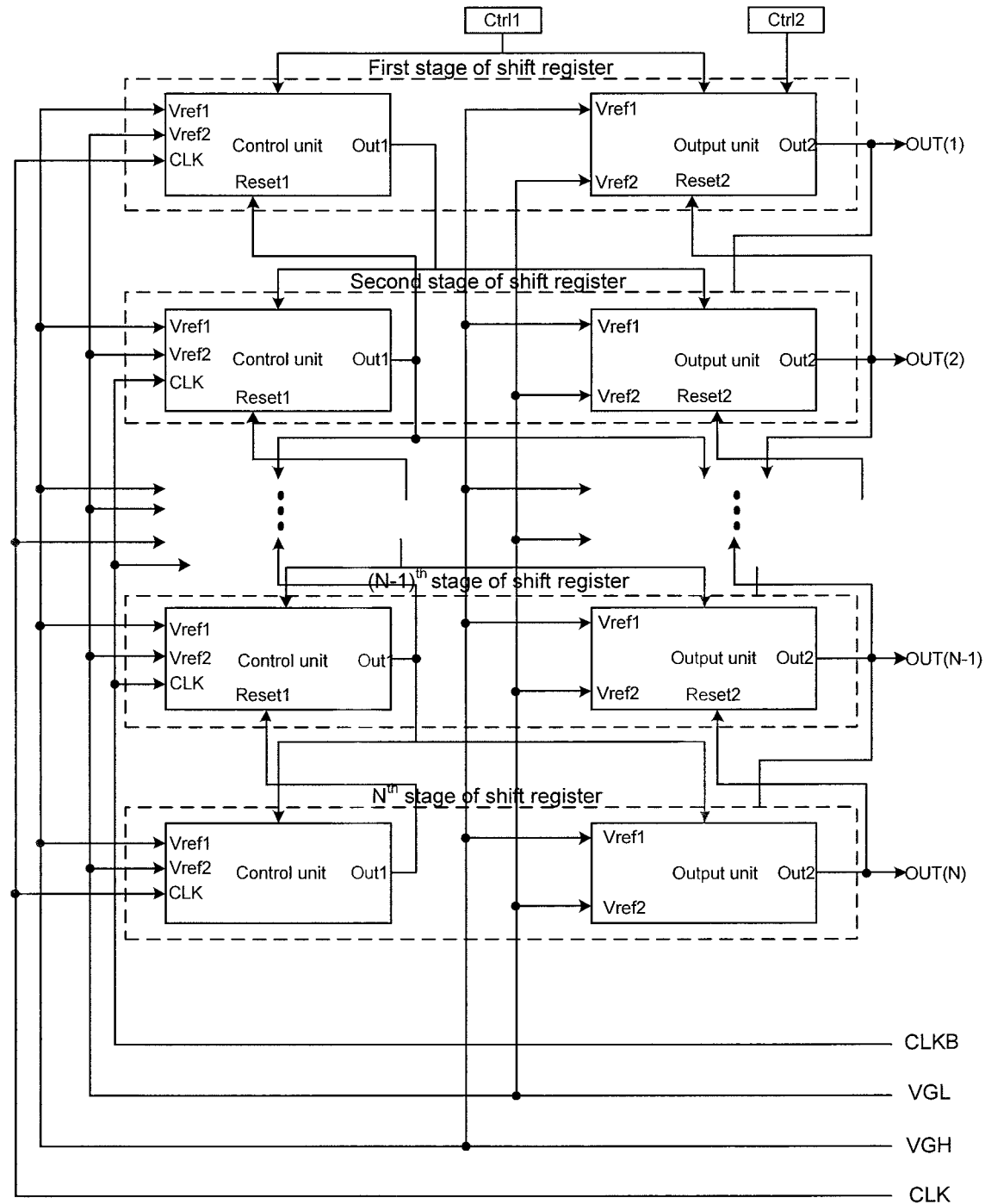

Specifically, for convenience of description, only four shift registers are shown in FIGS. 10 and 11, which are a first stage of shift register, a second stage of shift register, an $(N-1)^{th}$ stage of shift register, and an $N^{th}$ stage of shift register, respectively. An output terminal Out2 of each of the various stages of shift registers except for the first stage of shift register and the $N^{th}$ stage of shift register not only outputs a gate enabling signal to a gate line connected to the output terminal Out2, but also inputs a second control signal Ctrl2 to a next stage of shift register adjacent to a current stage of shift register and inputs a second reset signal Reset2 to a previous stage of shift register adjacent to the current stage of shift register. At the same time, an output terminal Out1 of each of the various stages of shift register not only inputs a signal to a first control terminal connected to the output terminal Out1 of an output unit of the current stage of shift register (as shown in FIG. 10) or a next stage of shift register adjacent to the current stage of shift register (as shown in FIG. 11), but also outputs a first control signal Ctrl1 to the next stage of shift register adjacent to the current stage of shift register and inputs a first reset signal Reset1 to a previous stage of shift register adjacent to the current stage of shift register.

As shown in FIG. 10, an output terminal Out1 of the first stage of shift register inputs a trigger signal to a first control terminal of an output unit of the current stage of shift register and a first control terminal of an control unit of the second stage of shift register, respectively, and an output terminal Out2 of the output unit of the first stage of shift register inputs a trigger signal to a first input terminal and a second control terminal (shown as one input terminal) of an output unit of the second stage of shift register.

As shown in FIG. 11, an output terminal Out1 of the first stage of shift register inputs a trigger signal to a control unit and an output unit of the second stage of shift register, respectively, comprising: inputting a trigger signal to a first control terminal of the control unit of the second stage of shift register and inputting a trigger signal to a first control terminal of the output unit of the second stage of shift register, and an output terminal Out2 of an output unit of the first stage of shift register inputs a trigger signal to a first input terminal and a second control terminal (shown as one input terminal) of the output unit of the second stage of shift register. An output terminal Out1 of a control unit of the last stage of shift register inputs a first reset signal to a second control terminal of a control unit of a previous stage of shift register adjacent to the current stage of shift register, and an output terminal Out2 of an output unit of the last stage of shift register inputs a second reset signal to a fourth input terminal of an output unit of the previous stage of shift register adjacent to the current stage of shift register.

The embodiments of the present disclosure further provide a display panel comprising the above-described gate driving circuit according to the embodiments of the present disclosure. The display panel may be applied in any product or component having a display function such as a mobile phone, a tablet, a television, a display, a notebook, a digital photo frame, a navigator etc. As a principle of solving the problem for the display panel is similar to that for the gate driving circuit, the implementation of the display panel can be known with reference to the implementation of the gate driving circuit described above, and the repeated parts will not be described in detail.

The embodiments of the present disclosure provide a gate driving circuit and a display panel. The control unit of the shift register in the gate driving circuit according to the embodiments of the present disclosure may input a dual pulse control signal to the first control terminal of the output unit; and the output unit outputs a scanning signal having a pulse width equal to a pulse period of the dual pulse control signal to a corresponding gate line under the control of the dual pulse control signal. In this way, the output unit can be controlled by the control unit to output a scanning signal of which a pulse width may be modulated, that is, the pulse width of the scanning signal output from the output unit is modulated by controlling the pulse period of the dual pulse control signal output from the control unit, to realize output of a gate signal of which a pulse width may be modulated.

At the same time, a structure of the shift register in the gate driving circuit according to the embodiments of the present disclosure comprises only the control unit and the output unit, which has a relatively simple structure and require few feedback signals, thereby facilitating realization of a narrow bezel design of the display panel. In addition, the shift register according to the embodiments of the present disclosure can provide a dual pulse control signal while providing a gate driving signal of which a pulse width may be modulated, which can facilitate later design of pixels, and provide the required dual pulse control signal and gate driving signal which may be modulated in the realization of internal and external compensation for the pixels, thereby being advantageous to improve an application range of the gate driving circuit.

It will be apparent to those skilled in the art that various modifications and variations can be made in the embodiments of the disclosure without departing from the spirit and scope of the embodiments of the disclosure. In this way, the present disclosure is intended to embrace such modifications and variations if these modifications and variations of the embodiments of the disclosure are within the scope of the appended claims and their equivalents.

We claim:

1. A gate driving circuit, comprising:
a plurality of cascaded shift registers in one-to-one correspondence with gate lines, each shift register comprising an output unit and a control unit, wherein
an output terminal of a control unit of each of the shift registers is connected to a first control terminal of an output unit of a current stage of shift register or a next stage of shift register which is adjacent to the current stage of shift register;
the control unit is configured to input a dual pulse control signal to the first control terminal of the output unit through the output terminal; and the output unit is configured to output a scanning signal having a pulse width equal to a pulse period of the dual pulse control signal to a corresponding gate line under the control of the dual pulse control signal;
wherein the control unit has a first control terminal configured to input a first control signal, a second control terminal configured to input a first reset signal, a third control terminal, a first input terminal and a second input terminal configured to input a first reference signal, a third input terminal configured to input a second reference signal, a fourth input terminal configured to input a clock signal and an output terminal connected to the first control terminal of the output unit; and the control unit is configured to output the second reference signal or the clock signal to the first control terminal of the output unit under the control of the first control signal, the first reset signal and the first reference signal; and
the output unit has a second control terminal and a first input terminal configured to input a second control signal, a third control terminal, a second input terminal and a third input terminal configured to input the first reference signal, a fourth input terminal configured to input a second reset signal, a fifth input terminal configured to input the second reference signal, and an output terminal configured to output a signal to the corresponding gate line; and the output unit is configured to output the first reference signal or the second reference signal to the corresponding gate line under the control of a level at the output terminal of the control unit, the first reference signal and the second control signal.

2. The gate driving circuit according to claim 1, wherein the control unit comprises a first pull-up unit, a first pull-down unit, a first output unit and a first control unit, wherein
the first pull-up unit has a control terminal configured to input the first control signal, an input terminal configured to input the first reference signal and an output terminal connected to a first node; and the first pull-up unit is configured to output the first reference signal to the first node under the control of the first control signal;
the first pull-down unit has a first control terminal connected to a second node, a second control terminal configured to input the first reset signal, an input terminal configured to input the second reference signal and an output terminal connected to the first node; and the first pull-down unit is configured to output the second reference signal to the first node under the control of a level of the second node or the first reset signal;
the first output unit has a first control terminal connected to the first node, a second control terminal configured to input the first reset signal, a third control terminal connected to the second node, a first input terminal configured to input the clock signal, a second input terminal configured to input the second reference signal and an output terminal connected to the first control terminal of the output unit; and the first output unit is configured to output the clock signal to the first control terminal of the output unit under the control of a level at the first node, and output the second reference signal to the first control terminal of the output unit under the control of a level at the second node or the first reset signal; and
the first control unit has a first control terminal and a first input terminal configured to input the first reference signal, a second control terminal connected to the first node, a second input terminal configured to input the second reference signal and an output terminal connected to the second node; and the first control unit is configured to output the first reference signal to the second node under the control of the first reference signal and output the second reference signal to the second node under the control of a level at the first node.

3. The gate driving circuit according to claim 2, wherein the first output unit comprises a first signal output unit and a second signal output unit, wherein
the first signal output unit has a control terminal connected to the first node, an input terminal configured to input the clock signal and an output terminal connected to the first control terminal of the output unit; and the first signal output unit is configured to output the clock signal to the first control terminal of the output unit under the control of the level at the first node; and the second signal output unit has a first control terminal configured to input the first reset signal, a second control terminal connected to the second node, an input terminal configured to input the second reference signal, and an output terminal connected to the first control terminal of the output unit; and the second signal output unit is configured to output the second reference signal to the first control terminal of the output unit under the control of the level at the second node or the first reset signal.

4. The gate driving circuit according to claim 3, wherein the first signal output unit comprises a first switch transistor and a first capacitor, wherein the first switch transistor has a gate connected to the first node, a source configured to input the clock signal and a drain connected to the first control terminal of the output unit; and the first capacitor is connected between the first node and the first control terminal of the output unit.

5. The gate driving circuit according to claim 3, wherein the second signal output unit comprises a second switch transistor and a third switch transistor, wherein the second switch transistor has a gate configured to input the first reset signal, a source configured to input the second reference signal and a drain connected to the first control terminal of the output unit; and the third switch transistor has a gate connected to the second node, a source configured to input the second reference signal and a drain connected to the first control terminal of the output unit.

6. The gate driving circuit according to claim 2, wherein the first pull-up unit comprises a fourth switch transistor, wherein the fourth switch transistor has a gate configured to input the first control signal, a source configured to input the first reference signal and a drain connected to the first node.

7. The gate driving circuit according to claim 2, wherein the first pull-down unit comprises a fifth switch transistor and a sixth switch transistor, wherein the fifth switch transistor has a gate connected to the second node, a source configured to input the second reference signal and a drain connected to the first node; and the sixth switch transistor has a gate configured to input the first reset signal, a source configured to input the second reference signal and a drain connected to the first node.

8. The gate driving circuit according to claim 2, wherein the first control unit comprises a seventh switch transistor and an eighth switch transistor, wherein the seventh switch transistor has a gate and a source configured to input the first reference signal and a drain connected to the second node; and the eighth switch transistor has a gate connected to the first node, a source configured to input the second reference signal and a drain connected to the second node.

9. The gate driving circuit according to claim 1, wherein the output unit comprises a second pull-up unit, a second pull-down unit, a second output unit and a second control unit, wherein the second pull-up unit has a control terminal connected to the output terminal of the control unit, an input terminal configured to input the second control signal and an output terminal connected to a third node; and the second pull-up unit is configured to output the second control signal to the third node under the control of the level at the output terminal of the control unit;

the second pull-down unit has a control terminal connected to a fourth node, an input terminal configured to input the second reference signal and an output terminal connected to the third node; and the second pull-down unit is configured to output the second reference signal to the third node under the control of a level at the fourth node;

the second output unit has a first control terminal connected to the third node, a second control terminal connected to the fourth node, a first input terminal configured to input the first reference signal, a second input terminal configured to input the second reference signal, a third input terminal configured to input the second reset signal and an output terminal configured to output a signal to the corresponding gate line; and the second output unit is configured to output the first reference signal to the corresponding gate line under the control the level at of the third node and output the second reference signal to the corresponding gate line under the control of the level at the fourth node; and the second control unit has a first control terminal and a first input terminal configured to input the first reference signal, a second control terminal configured to input the second control signal, a third control terminal connected to the third node, a second input terminal configured to input the second reference signal and an output terminal connected to the fourth node; and the second control unit is configured to output the first reference signal to the fourth node under the control of the first reference signal and output the second reference signal to the fourth node under the control of the second control signal or the level at the third node.

10. The gate driving circuit according to claim 9, wherein the second output unit comprises a third signal output unit and a fourth signal output unit, wherein the third signal output unit has a control terminal connected to the third node, a first input terminal configured to input the first reference signal, a second input terminal configured to input the second reset signal and an output terminal configured to output a signal to the corresponding gate line; and the third signal output unit is configured to output the first reference signal to the corresponding gate line under the control of the level at the third node; and the fourth signal output unit has a control terminal connected to the fourth node, an input terminal configured to input the second reference signal and an output terminal configured to output a signal to the corresponding gate line; and the fourth signal output unit is configured to output the second reference signal to the corresponding gate line under the control of the level at the fourth node.

11. The gate driving circuit according to claim 10, wherein the third signal output unit comprises a ninth switch transistor, a second capacitor and a third capacitor, wherein the ninth switch transistor has a gate connected to the third node, a source configured to input the first reference signal and a drain configured to output a signal to the corresponding gate line;

the second capacitor is connected between the third node and the drain of the ninth switch transistor; and the third capacitor has one terminal configured to input the second reset signal and the other terminal connected to the third node.

12. The gate driving circuit according to claim 10, wherein the fourth signal output unit comprises a tenth switch transistor, wherein the tenth switch transistor has a gate connected to the fourth node, a source configured to input the second reference signal and a drain configured to output a signal to the corresponding gate line.

13. The gate driving circuit according to claim 9, wherein the second pull-up unit comprises an eleventh switch transistor, wherein the eleventh switch transistor has a gate connected to the output terminal of the control unit, a source configured to input the second control signal and a drain connected to the third node.

14. The gate driving circuit according to claim 9, wherein the second pull-down unit comprises a twelfth switch transistor, wherein the twelfth switch transistor has a gate connected to the fourth node, a source configured to input the second reference signal and a drain connected to the third node.

15. The gate driving circuit according to claim 9, wherein the second control unit comprises a thirteenth switch transistor, a fourteenth switch transistor and a fifteenth switch transistor, wherein the thirteenth switch transistor has a gate and a source configured to input the first reference signal and a drain connected to the fourth node;

the fourteenth switch transistor has a gate configured to input the second control signal, a source configured to input the second reference signal and a drain connected to the fourth node; and the fifteenth switch transistor has a gate connected to the third node, a source configured to input the second reference signal and a drain connected to the fourth node.

16. The gate driving circuit according to claim 9, wherein the output unit further comprises a load resistor and a load capacitor, wherein the load resistor has one terminal connected to the output terminal of the output unit and the other terminal connected to one terminal of the load capacitor, and the load capacitor has the other terminal connected to a ground level signal terminal.

17. The gate driving circuit according to claim 1, wherein a control unit of each of various stages of shift register except for a first stage of shift register and a last stage of shift register has an output terminal configured to input a trigger signal to a first control terminal of a control unit of a next stage of shift register which is adjacent to the current stage of shift register and input a first reset signal to a second control terminal of a control unit of a previous stage of shift register which is adjacent to the current stage of shift register, and an output unit of each of the various stages of shift register except for the first stage of shift register and the last stage of shift register has an output terminal configured to input a trigger signal to a first input terminal and a second control terminal of an output unit of the next stage of shift register which is adjacent to the current stage of shift register and input a second reset signal to a fourth input terminal of an output unit of the previous stage of shift register which is adjacent to the current stage of shift register;

a control unit of the first stage of shift register has an output terminal configured to input a trigger signal to a first control terminal of a control unit of a second stage of shift register, and an output unit of the first stage of shift register has an output terminal configured to input a trigger signal to a first input terminal and a second control terminal of an output unit of the second stage of shift register; and a control unit of the last stage of shift register has an output terminal configured to input a first reset signal to a second control terminal of a control unit of a previous stage of shift register which is adjacent to the last stage of shift register, and an output unit of the last stage of shift register has an output terminal configured to input a second reset signal to a fourth input terminal of an output unit of the previous stage of shift register which is adjacent to the last stage of shift register.

18. A display panel comprising the gate driving circuit according to claim 1.

* * * * *